US007652681B2

(12) United States Patent
Chang et al.

(10) Patent No.: US 7,652,681 B2
(45) Date of Patent: Jan. 26, 2010

(54) SYSTEMS FOR DISPLAYING IMAGES INVOLVING DISPLAY PANELS

(75) Inventors: Shih-Chang Chang, Jhudong Township (TW); Du-Zen Peng, Jhubei (TW)

(73) Assignee: TPO Displays Corp., Chu-Nan (TW)

( * ) Notice: Subject to any disclaimer, the term of this patent is extended or adjusted under 35 U.S.C. 154(b) by 692 days.

(21) Appl. No.: 11/402,588

(22) Filed: Apr. 11, 2006

(65) Prior Publication Data

US 2007/0236483 A1 Oct. 11, 2007

(51) Int. Cl.
*G09G 5/02* (2006.01)
*H01L 29/18* (2006.01)

(52) U.S. Cl. .......................... 345/694; 257/88; 349/139

(58) Field of Classification Search ......... 345/694–695; 349/42–47; 257/59, 72, 88, 89
See application file for complete search history.

(56) References Cited

U.S. PATENT DOCUMENTS 6,812,637 B2 * 11/2004 Cok et al. ................... 313/503
7,394,105 B2 * 7/2008 Goto ........................... 257/88
2006/0076550 A1 * 4/2006 Kwak et al. .................... 257/13
2007/0242202 A1 * 10/2007 Kawase ...................... 349/139

FOREIGN PATENT DOCUMENTS

CN 1622178 6/2005

* cited by examiner

*Primary Examiner*—Richard Hjerpe
*Assistant Examiner*—Steven E Holton
(74) *Attorney, Agent, or Firm*—Liu & Liu

(57) ABSTRACT

Systems for displaying images are provided. A representative system comprises a display panel. The display panel comprises first, second and third signal lines, and first and second pixel areas. The first and second signal lines are extended straight along a first direction. The third signal line is extended straight along a second direction and interlaced with the first and second signal lines. The first pixel area is coupled to the first signal line, and the second pixel area is coupled to the second signal line and the first signal line and has a second driving area. A relative position of a first driving area in the first pixel area is different from that of a second driving area in the second pixel area and the first and second pixels display the same color.

14 Claims, 9 Drawing Sheets

SYSTEMS FOR DISPLAYING IMAGES INVOLVING DISPLAY PANELS

BACKGROUND

The invention relates to display panels, and in particular to fabricating methods for display panels reducing mura defects.

FIG. 1 is a schematic diagram of a conventional display panel. The display panel comprises a plurality of pixel areas $P_{11}$ to $P_{35}$. Driving areas $D_{11}$ to $D_{35}$ are respectively disposed in the pixel areas $P_{11}$ to $P_{35}$. As shown in FIG. 1, the relative positions of the driving areas in the pixel areas along one column are the same.

The pixel areas along the first column are given as an example. The relative position of the driving area $D_{11}$ in the pixel area $P_{11}$ is the same as that of the driving area $D_{21}$ in the pixel area $P_{21}$, and the relative position of the driving area $D_{21}$ in the pixel area $P_{21}$ is the same as that of the driving area $D_{31}$ in the pixel area $P_{31}$.

When a laser beam 10 irradiates the driving areas $D_{11}$ to $D_{35}$, driving elements are formed in the driving areas $D_{11}$ to $D_{35}$ to control the brightness of the pixel areas $P_{11}$ to $P_{35}$. Since the width of the display panel is much greater than that of the laser beam 10, the laser beam 10 must move by stepping to irradiate all of the driving areas in the display panel.

Moreover, since the energy of the laser beam 10 in different periods may be different, the qualities of the driving areas irradiated by the laser beam 10 in the different periods are different. Referring to FIG. 1, it is assumed that the laser beam irradiates the driving areas $D_{11}$ to $D_{31}$ in the pixel areas $P_{11}$ to $P_{31}$ along the first column in a first period, the laser beam irradiates s the driving areas $D_{12}$ to $D_{32}$ in the pixel areas $P_{12}$ to $P_{32}$ along the second column in a second period, and the laser beam irradiates the driving areas $D_{13}$ to $D_{33}$ in the pixel areas $P_{13}$ to $P_{33}$ along the third column in a third period.

Since all the driving areas $D_{11}$ to $D_{31}$ are irradiated by the laser beam 10 in the first period, the qualities of the driving areas $D_{11}$ to $D_{31}$ are the same. Similarly, the qualities of the driving areas $D_{12}$ to $D_{32}$ are the same, and the qualities of the driving areas $D_{13}$ to $D_{33}$ are also the same. When the energy of the laser beam in the second period is different from that in the first and third periods, the qualities of the driving areas $D_{12}$ to $D_{32}$ are different from those of the driving areas $D_{11}$ to $D_{31}$ and $D_{13}$ to $D_{33}$. Undesirable mura defects can easily occur in the pixel areas $P_{12}$ to $P_{32}$ along the second column.

Additionally, since abnormal laser beam, such as the leaser beam in the second period, cyclically occurs, the mura defects are cyclically generated.

SUMMARY

Systems for displaying images are provided. In this regard, an embodiment of such a system comprises a display area comprising first, second and third signal lines, and first and second pixel areas. The first and second signal lines are extended straight along a first direction. The third signal line is extended straight along a second direction and interlaced with the first and second signal lines. The first pixel area is coupled to the first signal line and the third signal line and has a first driving area. The second pixel area is coupled to the second signal line and the third signal line and has a second driving area. The first and second signal lines can be one of gate lines and source lines, and the third signal line can be another one of the gate line and source line. A relative position of the first driving area in the first pixel area is different from that of the second driving area in the second pixel area.

Another embodiment of a system for displaying images comprises a display area comprising first to fifth pixel areas. The first pixel area has a first driving area. The second pixel area has a second driving area. The third area has a third driving area. The fourth pixel area has a fourth driving area. The fifth pixel area has a fifth driving area. The first and second pixel areas emit light of the same color, and a relative position of the second driving area in the second pixel area is different from that of the first driving area in the first pixel area. The first, third and fourth pixel areas are arranged in a delta structure. The second, third and fifth pixel areas are arranged in the delta structure.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 1:
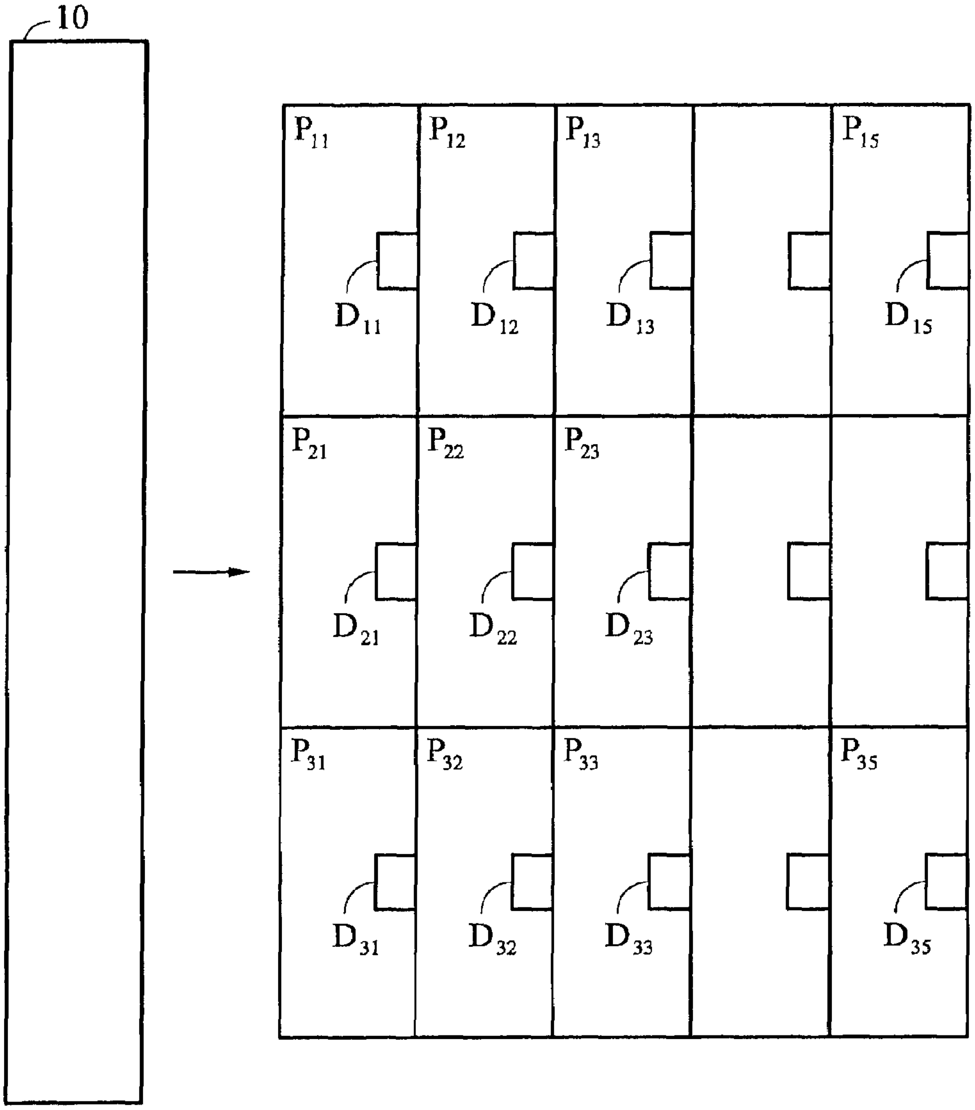
FIG. 1 (PRIOR ART)
FIG. 1 is a schematic diagram of a conventional display panel.
Figure 2A:
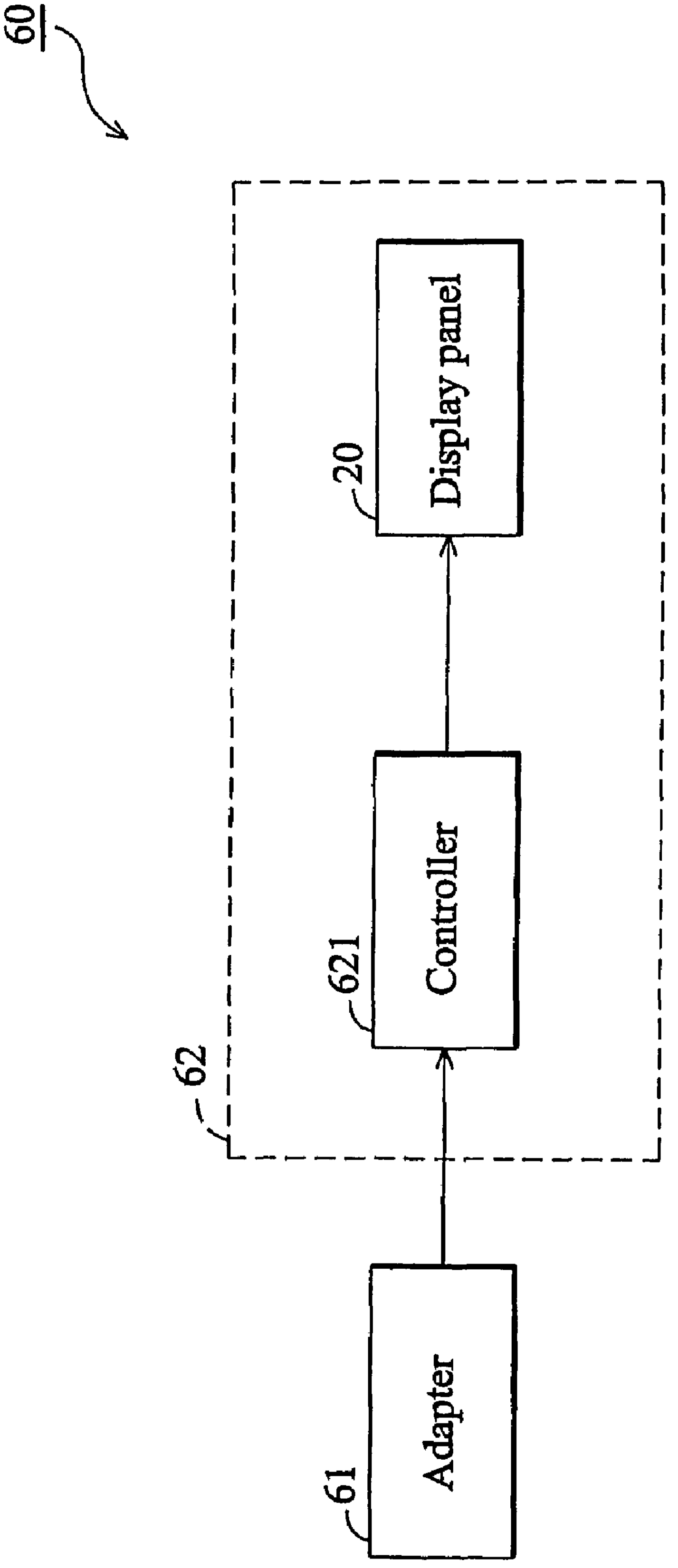
FIG. 2*a* is a schematic diagram of an embodiment of an electronic device.

Exemplary embodiments of systems for displaying images will now be described. In this regard, FIG. 2*a* is a schematic diagram of an embodiment of such a system comprises an electronic device. Electronic device 60 comprises an adapter 61 and a display device 62. Adapter 61 supplies power and drives display device 62. Display device 62 comprises a controller 621 and a display panel 20. Controller 621 coupled to the display panel 20 controls the display panel 20 to render an image in accordance with the adapter 61.

Figure 2B:
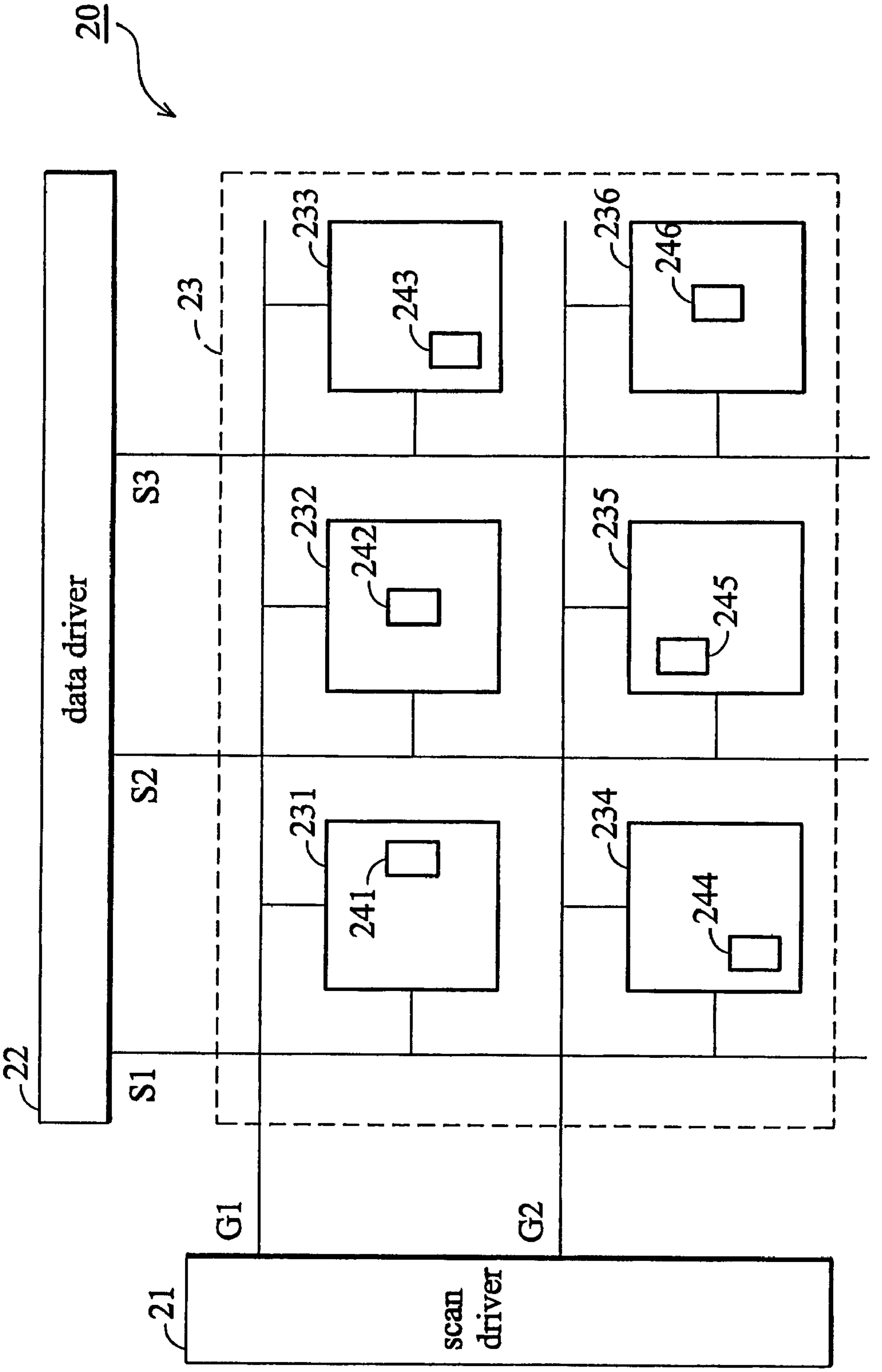
FIG. 2*b* is a schematic diagram of an embodiment of a display device.

As shown in FIG. 2*b*, display panel 20 comprises a scan driver 21, a data driver 22, and a display area 23. The scan driver 21 provides scan signals to the display area 23 through gate lines G1 and G2. The gate lines G1 and G2 are extended straight along a first direction. In FIG. 2, the gate lines G1 and G2 are extended along a horizontal direction.

The data driver 22 provides data signals to the display area 23 through source lines S1 to S3. The source lines S1 to S3 are extended straight along a second direction and interlaced with the gate lines G1 and G2. In FIG. 2, the source lines S1 to S3 are extended along a vertical direction.

The display area 23 is formed by the interlacing gate lines and the source lines. For clarity, the display area 23 shows only two gate lines G1 and G2 and three source lines S1 to S3. Each set of interlaced gate lines and source lines controls one pixel area. For example, the interlaced gate line G1 and source line S1 control a pixel area 231.

The pixel areas 234 to 236 also respectively display red, green, and blue light as do the pixel areas 231 to 233. Alternatively, light from the pixel areas 234 to 236 is different from that of the pixel areas 231 to 233, for example, the pixel areas 234 to 236 respectively display green, red, and blue light. In the embodiment in FIG. 2, the measurements of the pixel areas 231 to 233 are the same. In actual application, the measurements of the pixel areas 231 to 233 are determined according to the quality of the light-emitting material.

Driving areas 241 to 246 are respectively disposed in the pixel areas 231 to 236. Each of the driving areas 241 to 246 has a driving element (not shown in FIG. 2), such as a thin film transistor, to drive the light-emitting elements of the pixel areas 231 to 236. A laser beam moves in a determined direction and irradiates the pixel areas 231 to 236. Relative positions of the driving areas 241 to 246 in the pixel areas 231 to 236 are determined according to the determined direction. When the determined direction is a top-down direction, the relative position of at least one driving area in the corresponding pixel area along one row is different from the relative positions of the other driving areas in the corresponding pixel areas along the row. For example, the relative position of the driving area 241 in the pixel area 231 is different from relative positions of the driving areas 242 and 243 in the pixel areas 232 and 233. In this embodiment in FIG. 2, the relative position of one driving area in the corresponding pixel area is different from the relative positions of the other driving areas in the corresponding pixel areas. Thus, mura defects does not occur when the determined direction is a top-down direction or left-right direction.

Figure 3A:
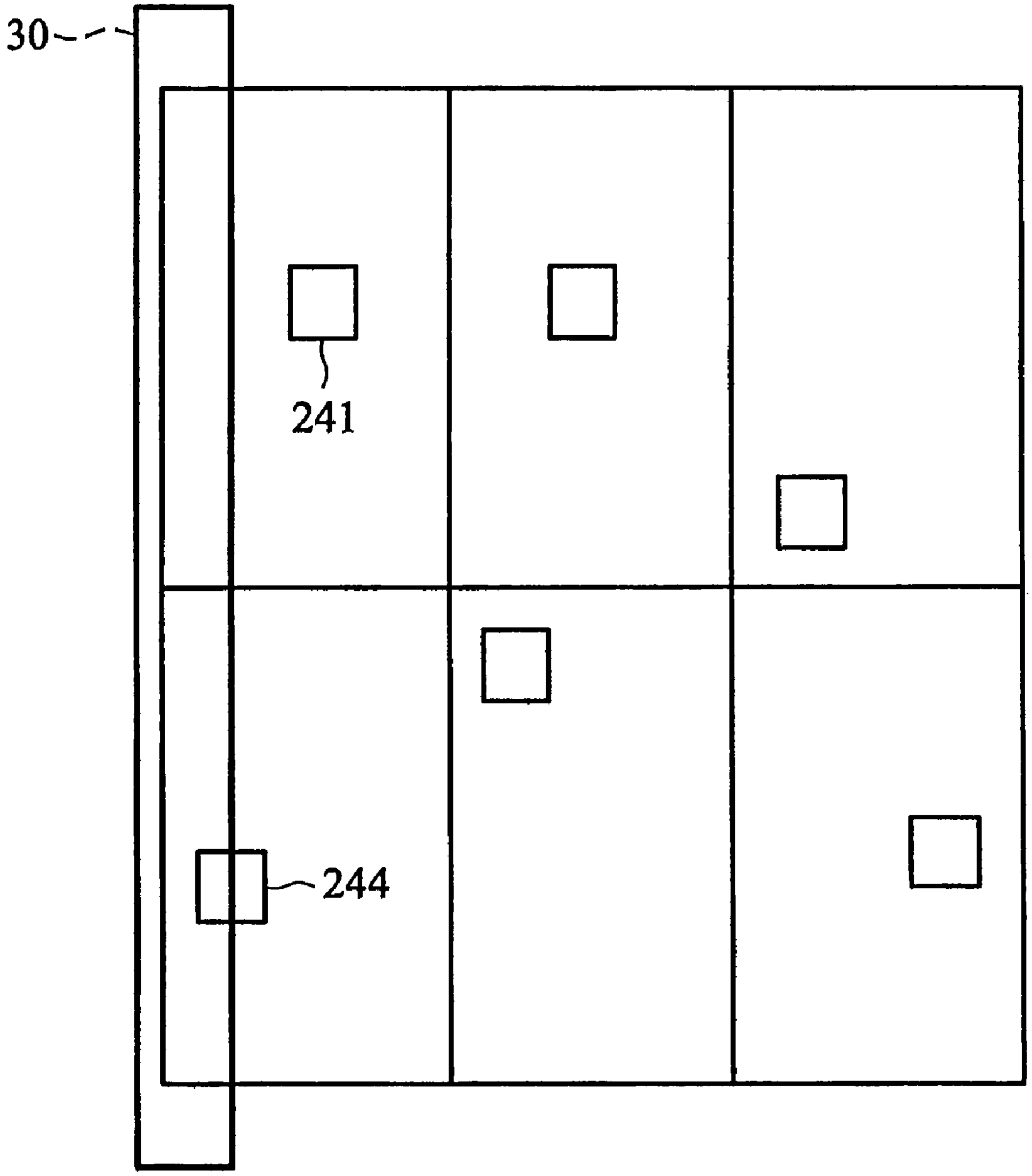
FIGS. 3*a* to 3*c* depict laser beam irradiation for the display panel in FIG. 2.
Figure 3B:
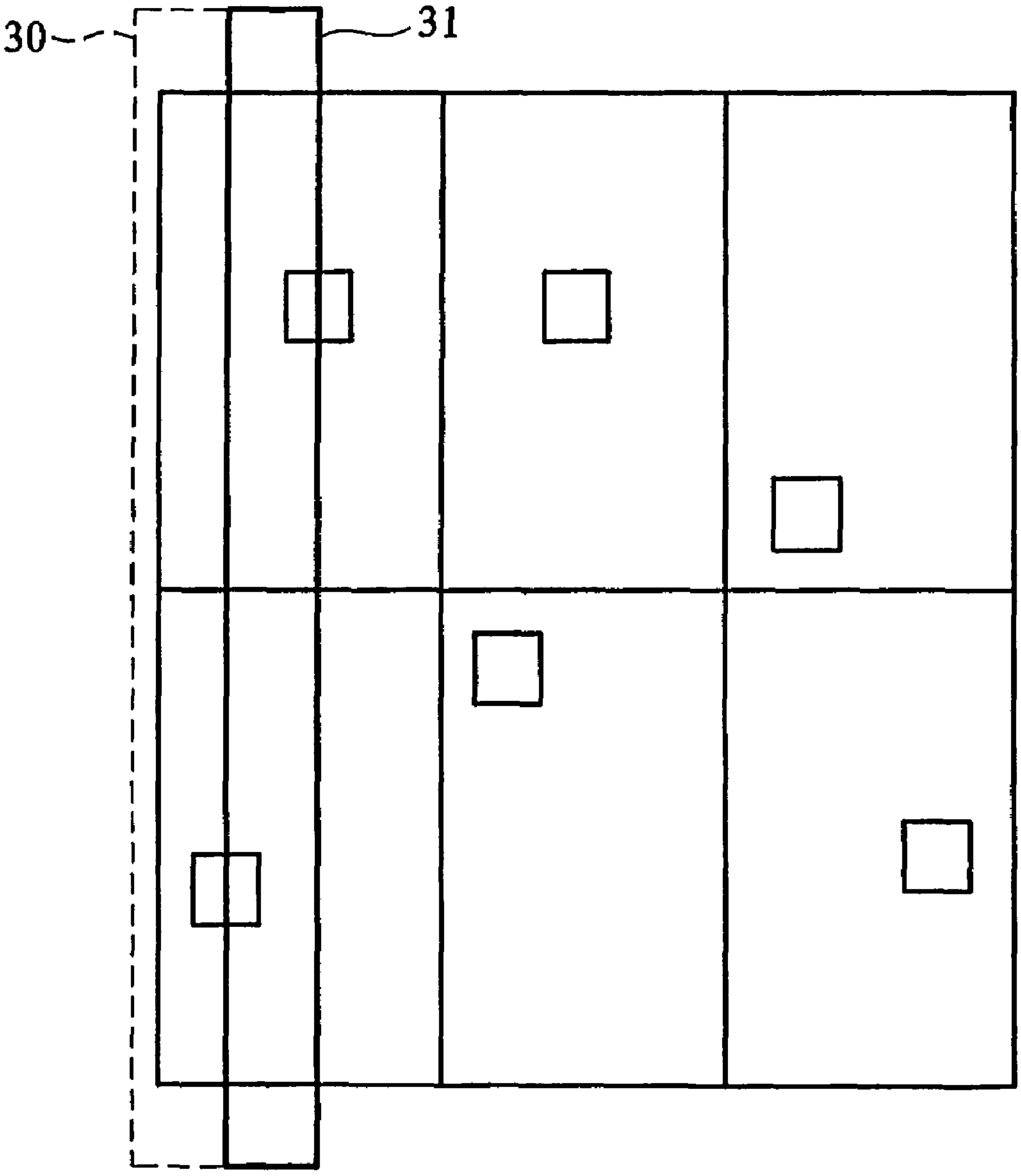
Figure 3C:
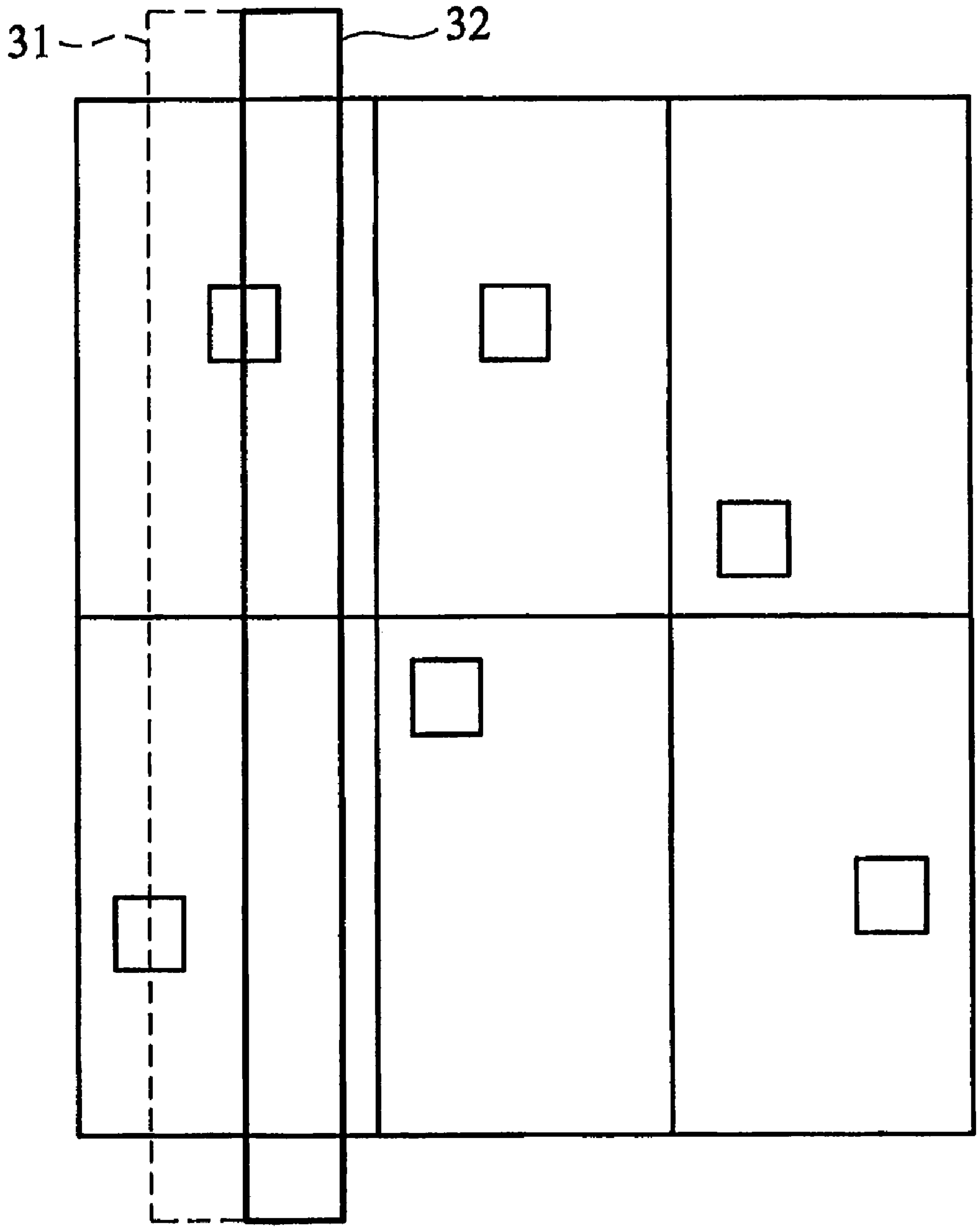

FIGS. 3*a* to 3*c* depict laser beam irradiation of the display area in FIG. 2. To describe clearly, FIGS. 3*a* to 3*b* do not show the gate lines and the source lines.

The laser beam of this embodiment moves horizontally in a left-right direction. As shown in FIG. 3*a*, due to the different relative positions of the driving areas in the pixel areas, only driving area 244 is irradiated by a laser beam 30 in a first period. As shown in FIG. 3*b*, in a second period following the first period, both driving areas 241 and 244 are irradiated by a laser beam 31. As shown in FIG. 3*c*, in a third period following the second period, only driving area 241 is irradiated by a laser beam 32.

As described above, the driving area 244 is irradiated by the laser beams 30 and 31, while the driving area 241 is irradiated by the laser beams 31 and 32. When the energy of the laser beams 30 and 32 is different, the qualities of the driving areas 241 and 244 are different, thus, undesirable mura defects are prevented.

If the driving elements within the driving areas 241 to 246 are implemented by thin film transistors, the relative positions of the driving areas are determined by controlling the positions of channels of the thin film transistors. FIGS. 4*a* to 4*h* are top views of the various channels of the transistors. When the laser beams irradiate the display area, an amorphous-silicon layer of the display area is transformed to poly-silicon layers 421 to 428. Gates 441 to 448 are then formed on the poly-silicon layers 421 to 428. The channels of the thin film transistors are formed below the gates.

Figure 4A:
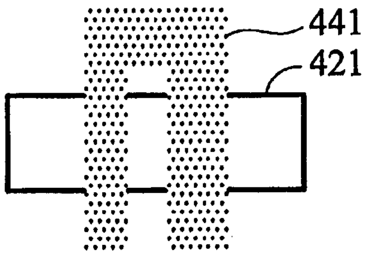
FIGS. 4*a* to 4*h* are top views of various channels of transistors within the driving areas in FIG. 2.
Figure 4B:
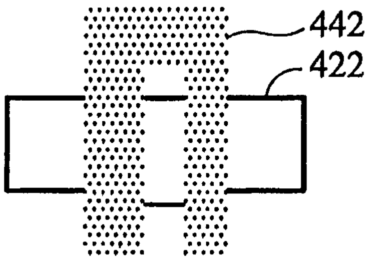
Figure 4C:
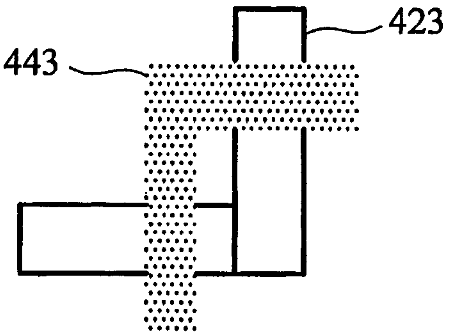
Figure 4D:
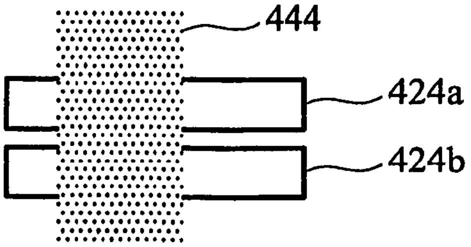
Figure 4E:
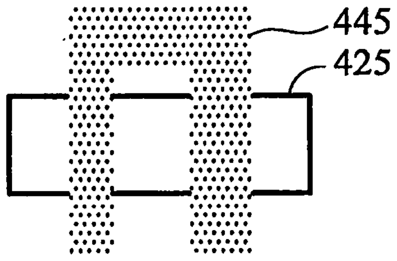
Figure 4F:
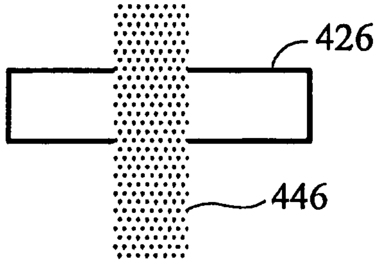
Figure 4G:
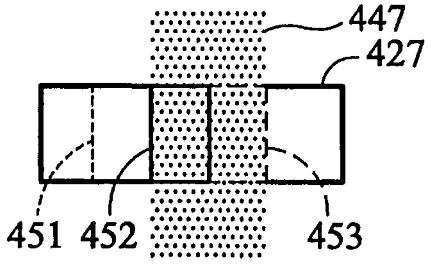
Figure 4H:
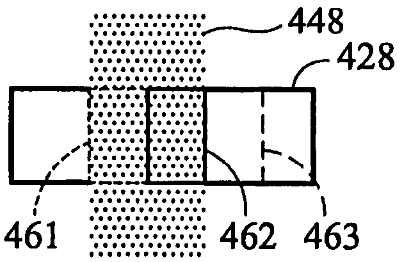

As shown in FIGS. 4*g* and 4*h*, the laser beam irradiates areas 451 and 461 in the first period, areas 452 and 462 in the second period, and areas 453 and 463 in the third period.

When gates 447 and 448 are respectively formed on the poly-silicon layers 427 and 428, the areas 452 and 453 form a first channel, and the areas 462 and 463 form a second channel. Since the areas 453 and 461 are irradiated by different laser beams, the qualities of the areas 453 and 461 are different, so that the qualities of the first and second channels are also different. Thus, the quality of a thin film transistor having the first channel is different from that of a thin film transistor having the second channel.

Figure 5:
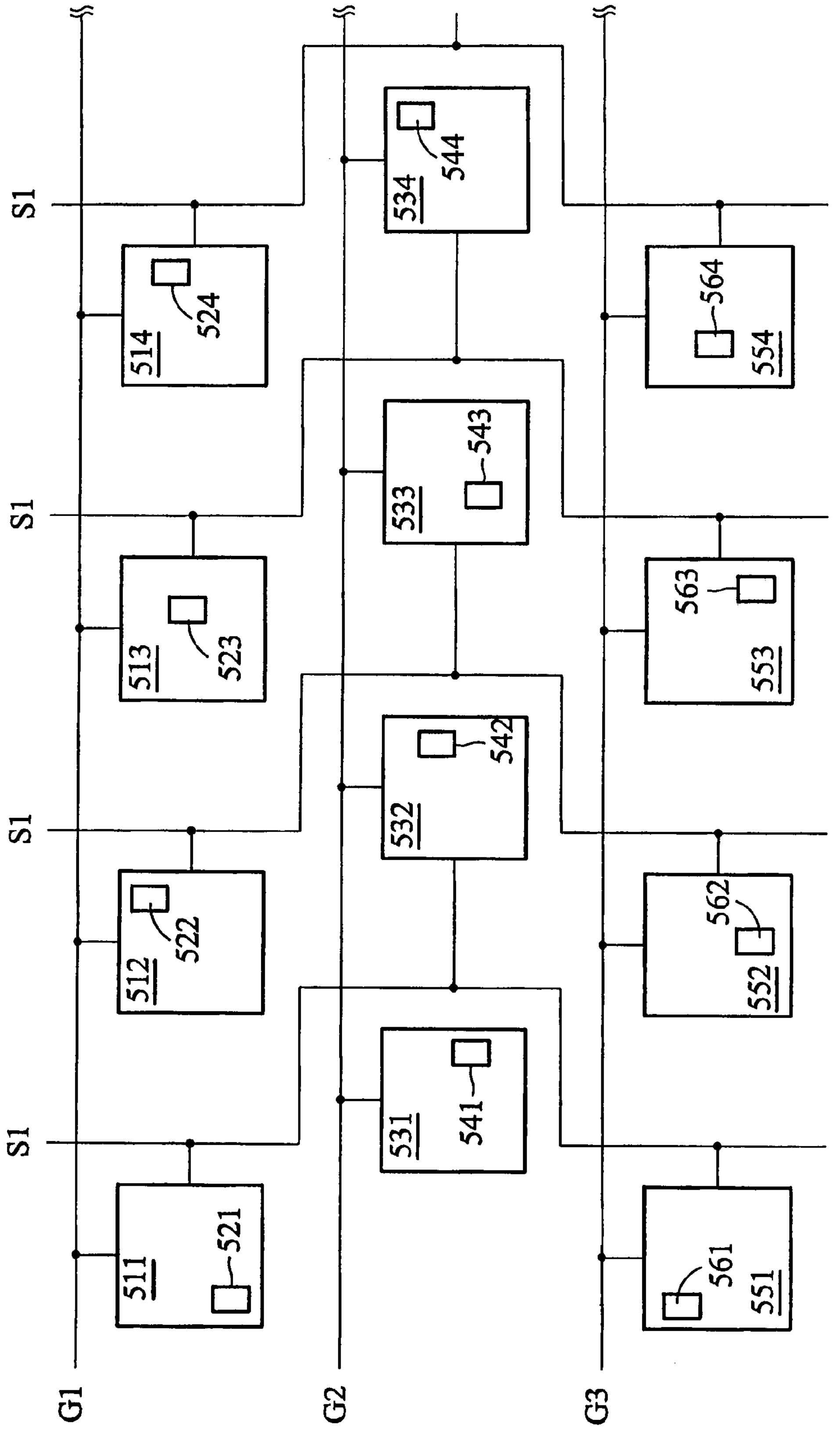
FIG. 5 is a schematic diagram of an embodiment of a display panel.

FIG. 5 shows an embodiment of a display area. Pixel areas 511 to 516 are coupled to a first gate line G1, pixel areas 531 to 536 are coupled to a second gate line G2, and pixel areas 551 to 556 are coupled to a third gate line G3. The first, second, and third gate lines G1-G3 are arranged in parallel and extended straight along a first direction. In the embodiment of FIG. 5, the first direction is horizontal.

The pixel areas 511, 532, and 551 are coupled to a first source line S1, the pixel areas 512, 533, and 552 are coupled to a second source line S2, and so on. All source lines S1-S4 are extended along a second direction. In FIG. 5, the second direction is vertical.

The pixel areas in FIG. 5 are arranged in a delta structure, different from the matrix structure in FIG. 2. For example, pixel areas 511, 512, and 531 are arranged in the delta structure and display red, green and blue color respectively, and pixel areas 531, 551, and 552 are arranged in the delta structure and display blue, red, and green color respectively. The delta structure is well known to those skilled in the art and further description is omitted here.

Driving areas 521 to 526 are respectively disposed in the pixel areas 511 to 516, driving areas 541 to 546 are respectively disposed in the pixel areas 531 to 536, and driving areas 561 to 566 are respectively disposed in the pixel areas 551 to 556.

It is assumed that a laser beam in this embodiment moves horizontally. When the pixel areas 511 and 551 display the same color, a relative position of the driving area 521 in the pixel area 511 is different from that of the driving area 561 in the pixel area 551. Similarly, when the pixel areas 512 and 552 display the same color, a relative position of the driving area 522 in the pixel area 512 is different from that of the driving area 562 in the pixel area 552.

It is assumed that a laser in this embodiment moves vertically. When the pixel areas 511 and 514 display the same color, the relative position of the driving area 521 in the pixel area 511 is different from that of the driving area 524 in the pixel area 514. Similarly, when the pixel areas 531 and 534 display the same color, a relative position of the driving area 541 in the pixel area 531 is different from that of the driving area 544 in the pixel area 534.

When driving elements within the driving areas are implemented by thin film transistors, qualities of the thin film transistors can be changed by adjusting positions of channels of thin film transistors. The driving areas 521 and 524 are given as an example. When a relative position of the thin film transistor of the driving area 521 in the pixel area 511 is different from that of the driving area 524 in the pixel area 514, the quality of the thin film transistor of the driving area 521 is different from that of driving area 524.

While the invention has been described in terms of preferred embodiment, it is to be understood that the invention is not limited thereto. On the contrary, it is intended to cover various modifications and similar s arrangements as would be apparent to those skilled in the art. Therefore, the scope of the appended claims should be accorded the broadest interpretation so as to encompass all such modifications and similar arrangements.

What is claimed is:

1. A system for displaying images comprising:

a display area comprising:

a first signal line extended straight along a first direction;

a second signal line extended straight along the first direction;

a third signal line extended straight along a second direction and interlaced with the first and second signal lines, wherein the first and second signal lines are source lines, and the third signal line is a gate line;

a first pixel area coupled to the first signal line and the third signal line and having a first driving area; and a second pixel area coupled to the second signal line and the third signal line and having a second driving area;

wherein a relative position of the first driving area in the first pixel area is different from that of the second driving area in the second pixel area and the first and second pixel areas display the same color.

2. The system as claimed in claim 1, wherein the measurement of the first pixel area is equal to that of the second pixel area.

3. The system as claimed in claim 1, wherein a first light-emitting element is disposed in the first pixel area, and a second light-emitting element is disposed in the second pixel area.

4. The system as claimed in claim 3, wherein first and second driving elements are disposed in the first and second driving areas and control brightness of the first and second light-emitting elements, respectively.

5. The system as claimed in claim 4, wherein the first and second driving elements are respectively first and second thin film transistors.

6. The system as claimed in claim 5, wherein a relative position of a gate of the first thin film transistor in the first pixel area is different from that of a gate of the second thin film transistor in the second pixel area.

7. The system as claimed in claim 5, wherein first and second thin film transistors are respectively disposed in the first and second driving areas, and a relative position of a gate of the first thin film transistor in the first pixel area is different from that of a gate of the second thin film transistor in the second pixel area.

8. The system as claimed in claim 1, further comprising:

a scan driver providing a plurality of scan signals to the display areas; and a data driver providing a plurality of data signals to the display area;

wherein the display area, the gate driver and the data driver are incorporated into a display panel.

9. The system as claimed in claim 1, further comprising:

a controller coupled to the display panel to control the display panel to render an image in accordance with an adapter.

10. A system for displaying images comprising:

a display area comprising:

a first signal line extended straight along a first direction;

a second signal line extended straight along the first direction;

a third signal line extended straight along a second direction and interlaced with the first and second signal lines;

a fourth signal line extended straight along the second direction;

a first pixel area coupled to the first signal line and the third signal line and having a first driving area; and a second pixel area coupled to the second signal line and the third signal line and having a second driving area; and a third pixel area coupled to the first signal line and the fourth signal line and having a third driving area;

wherein a relative position of the first driving area in the first pixel area is different from that of the second driving area in the second pixel area and the first and second pixel areas display the same color, and wherein a relative position of the third driving area in the third pixel area is different from that of the first driving area in the first pixel area, and the first and third pixel areas display the same color.

11. A system for displaying images comprising:

a display area comprising:

a first signal line extended straight along a first direction;

a second signal line extended straight along the first direction;

a third signal line extended straight along a second direction and interlaced with the first and second signal lines;

a fourth signal line extended along the second direction and interlaced with the first and second signal lines;

a fifth signal line disposed between the first and second signal lines, extended along the first direction, and interlaced with the third and fourth signal lines, wherein the first, second and fifth signal lines are source lines, and the third and fourth signal lines are gate lines;

a first pixel area coupled to the first signal line and the third signal line and having a first driving area;

a second pixel area coupled to the second signal line and the third signal line and having a second driving area;

wherein a relative position of the first driving area in the first pixel area is different from that of the second driving area in the second pixel area and the first and second pixel areas display the same color;

a third pixel area coupled to the third signal line and the fifth signal line and having a third driving area; and a fourth pixel area coupled to the first signal line and the fourth signal line, wherein the first, third, fourth pixel areas are arranged in a delta structure.

12. The system as claimed in claim 11, further comprising:

a fifth pixel area coupled to the second signal line and the fourth signal line, wherein the second, third, fifth pixel areas are arranged in a delta structure.

13. The system as claimed in claim 12, wherein the second, third and fifth pixel areas display red, green and blue color respectively.

14. The system as claimed in claim 11, wherein the first, third and fourth pixel areas display red, green and blue color respectively.

* * * * *